(12) United States Patent
Sager

(10) Patent No.: US 6,341,327 B1
(45) Date of Patent: Jan. 22, 2002

(54) CONTENT ADDRESSABLE MEMORY ADDRESSABLE BY REDUNDANT FORM INPUT

(75) Inventor: David J. Sager, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/133,602

(22) Filed: Aug. 13, 1998

(51) Int. Cl.[7] ................................................ G06F 12/02
(52) U.S. Cl. .......................................... 711/108; 365/49
(58) Field of Search ................................. 711/108, 128; 365/49

(56) References Cited

U.S. PATENT DOCUMENTS

| 3,527,930 A | 9/1970 | Cocke et al. | |
|---|---|---|---|
| 3,917,935 A | 11/1975 | Lazecki | |
| 4,337,519 A | 6/1982 | Nishimoto | |
| 4,473,887 A | 9/1984 | Odaka | |
| 4,534,029 A | 8/1985 | Singh et al. | |
| 4,603,397 A | 7/1986 | Ohtsuki et al. | |
| 4,636,973 A | 1/1987 | Cantwell | |
| 4,952,823 A | 8/1990 | Guo | |
| 5,245,576 A | 9/1993 | Foss et al. | 365/200 |
| 5,467,318 A | 11/1995 | Motomura | |
| 5,583,806 A | 12/1996 | Widigen et al. | |
| 5,625,582 A | 4/1997 | Timko | |
| 5,659,495 A | 8/1997 | Briggs | |
| 5,677,883 A | 10/1997 | Miwa | 365/200 |
| 5,754,819 A | 5/1998 | Lynch et al. | |
| 5,893,137 A | 4/1999 | Parks et al. | 711/108 |
| 5,815,420 A | 9/1999 | Steiss | |
| 5,953,745 A | 9/1999 | Lattimore et al. | 711/162 |
| 6,172,933 B1 * | 1/2001 | Sager | 365/230.01 |

FOREIGN PATENT DOCUMENTS

| EP | 0 210 752 A2 | 2/1987 |
|---|---|---|
| GB | 2 063 166 A | 6/1981 |
| GB | 2 077 190 A | 12/1981 |

OTHER PUBLICATIONS

"Evaluation of A+B=K Conditions Without Carry Propagation", Jodi Cortadella and Jose M. Llaberia, IEEE Transaction on Computers, vol. 41, No. 11, Nov., 1991, pp 1–10.

"The Half–Adder Form and Early Branch Conditions Resolution," David Lutz and D.N. Jayasimha, 1997, pp. 1–8.

"Early Zero Detection", David R. Lutz and D.N. Jayasimha, 1997, pp. 1–6.

Lammers, David, ". . . While IBM Shows Path to GHz Processors," *Electronic Engineering Times*, p. 4, Feb. 9, 1998.

* cited by examiner

*Primary Examiner*—Hiep T. Nguyen
(74) *Attorney, Agent, or Firm*—Kenyon & Kenyon

(57) ABSTRACT

A content addressable memory compares the value of redundant form input data to non-redundant form values stored in registers of the memory. The memory decodes the redundant form input data in a data decoder. Thereafter, the CAM performs match detection on the decoded data. The present invention performs decoding and match detection more quickly than traditional adders and even more quickly than complete redundant form adders.

7 Claims, 4 Drawing Sheets

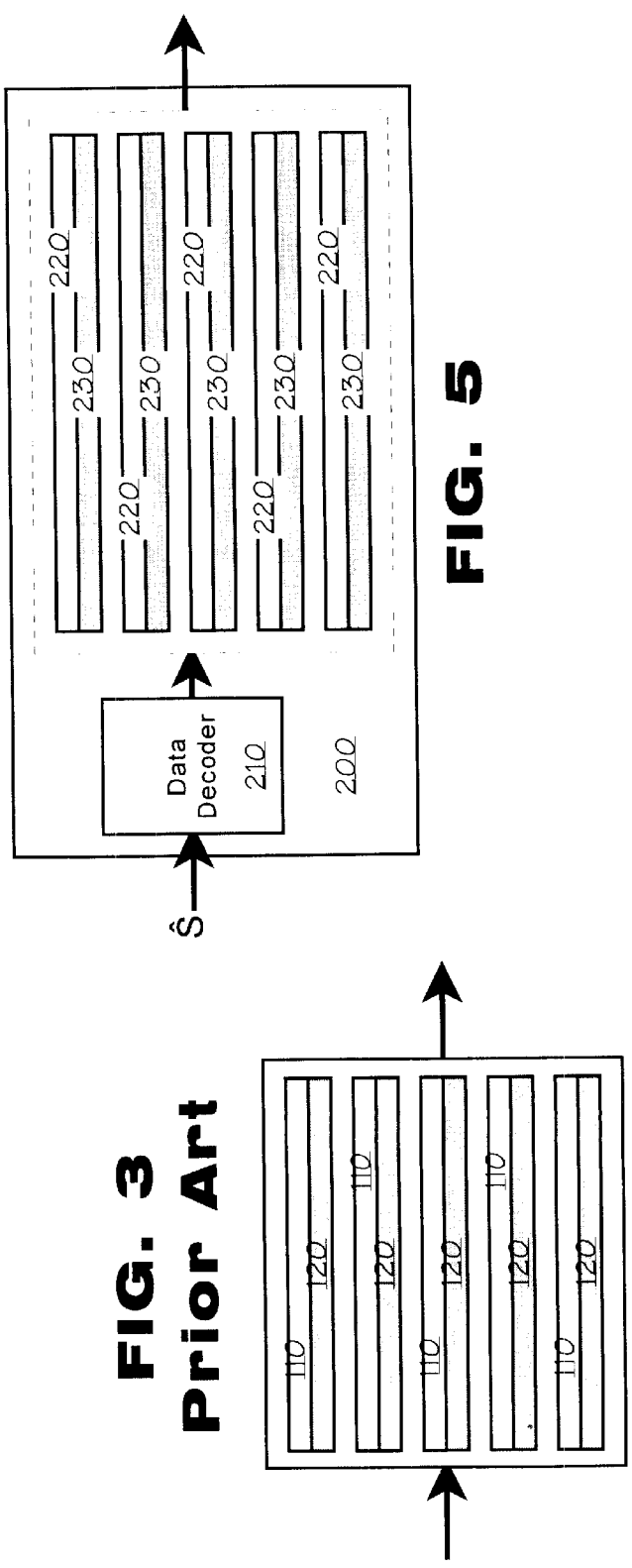
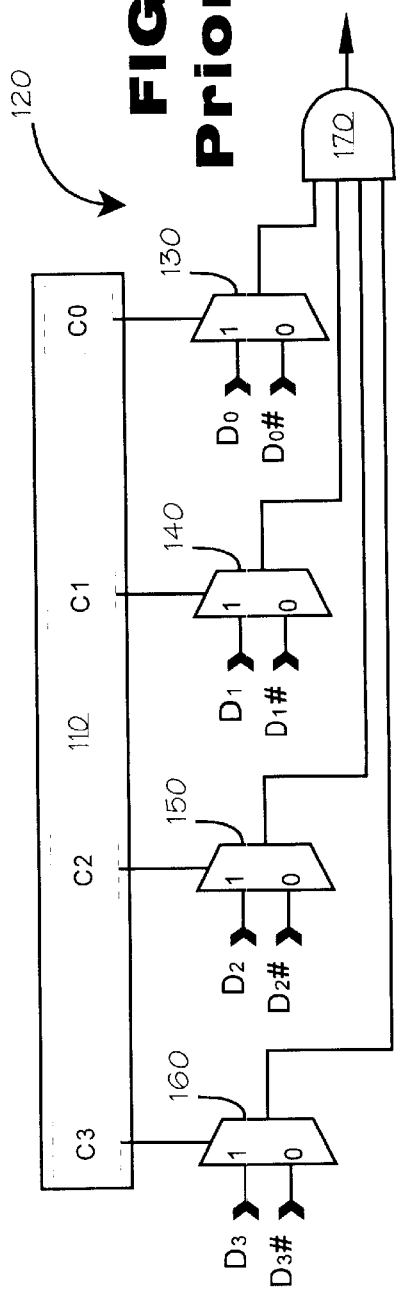

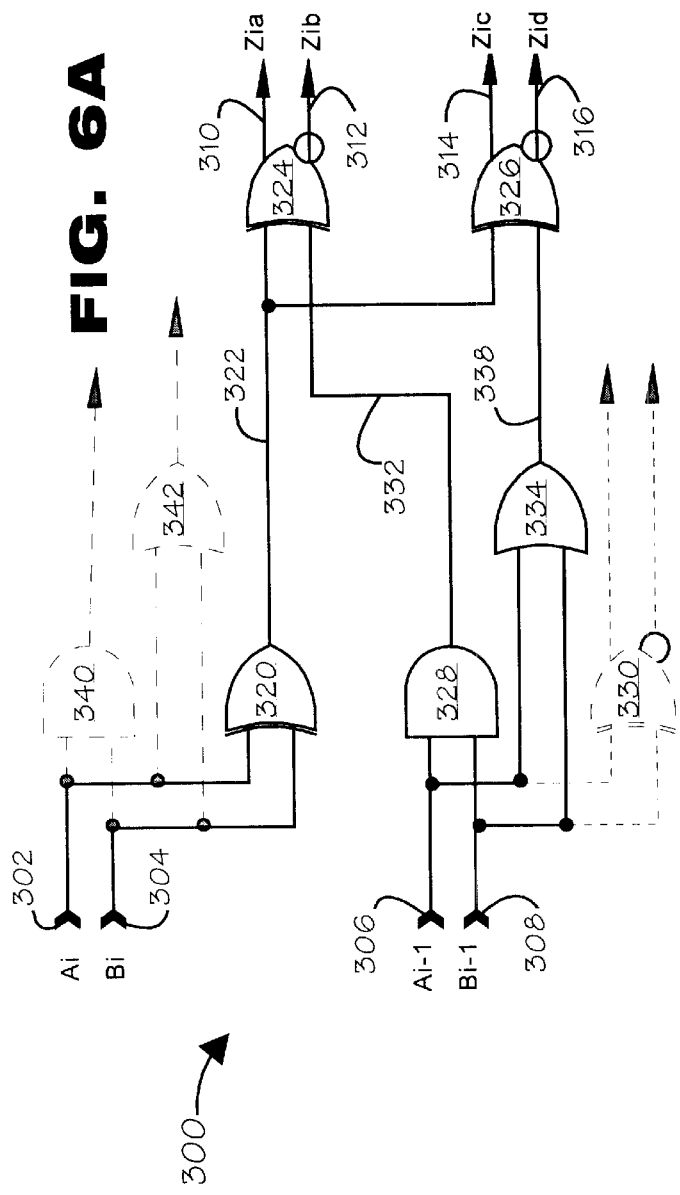
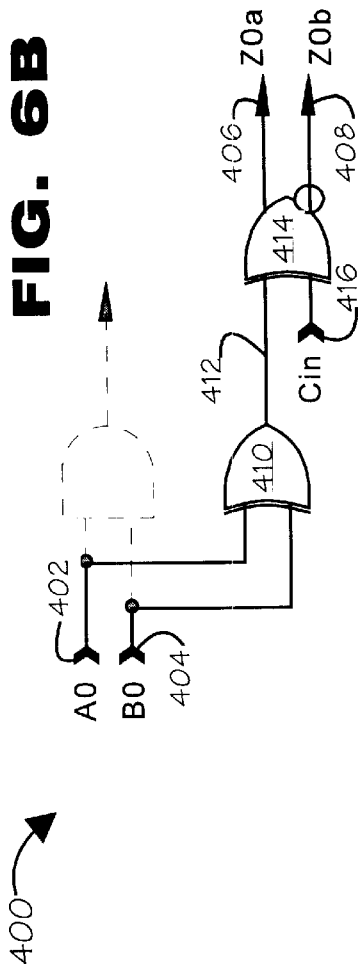

US 6,341,327 B1

CONTENT ADDRESSABLE MEMORY ADDRESSABLE BY REDUNDANT FORM INPUT

BACKGROUND OF THE INVENTION

The present invention relates to a content addressable memory suitable for use with redundant form input signals.

It is a goal of memory systems to fulfill requests for stored data with as little delay as possible. Often, the requesting agent cannot achieve forward progress without the requested information. This principle holds true for content addressable memories ("CAMs").

However, increasingly, arithmetic operations are included as part of a memory operation. That is, a request for data defines one or more arithmetic operations whose result is to be applied to a memory as an address. Any time spent completing an arithmetic operation is delay introduced to a memory request that includes the arithmetic operation. Thus, it becomes a goal of memory systems to reduce the time required to perform any arithmetic operations included in a memory request.

FIG. 1 illustrates a traditional adder circuit. There, an addition performed on two multi-bit values X ($X=X_0\_X_3$) and Y ($Y=Y_0\_Y_3$) generates a multi-bit sum S ($S=S_0\_S_3$) and a carry out $C_{out}$. The traditional adder includes an internal carry chain wherein a carry from a first bit position i may affect the value of the sum at a second bit position i+1. Carries must propagate through the entire length of the adder before true results may be obtained therefrom. The internal carry chain causes the traditional adder to be slow. There is a need in the art for a memory system that improves the processing speed of memory requests that require mathematical preprocessing operations.

Redundant form adders are known to be faster than traditional adders. Shown in FIG. 2, a redundant form adder omits the internal carry chain that characterizes the traditional adder. Instead, for each bit position i of inputs X, Y and Z, the redundant form adder generates a multi-bit sum $\hat{S}_i$. The output $\hat{S}$ ($\hat{S}=\hat{S}_0\_\hat{S}_n$) is said to be in "redundant form" because two bits are used per bit position rather than a single bit to represent a sum result that may be more efficiently represented by only a single bit. To reduce the redundant form result $\hat{S}$ to non-redundant form, the two bits of each "bit position" $\hat{S}_i$ may be input to a traditional adder, such as the adder of FIG. 1.

The redundant form adder provides significant processing advantages over traditional adder, particularly where a number of additions are performed in sequence. For a plural number of sequential adds, the traditional adder must complete the carry chain of each add before it may begin a subsequent add. However, redundant form processing permits quick additions to be performed. A carry chain may be omitted until a redundant form sum is obtained from the final addition. When the redundant form sum is obtained, it may be converted to non-redundant form by use of only a single carry chain.

No known memory system retrieves data based on redundant form input data.

Content addressable memories are known per se. A block diagram of a known CAM 100 is shown in FIG. 3. The CAM 100 includes a plurality of registers 110 each of which stores data. When input data is applied to the CAM 100, it generates an output identifying which registers, if any, store data having the same value as the input data. Typically, the CAM 110 generates an output signal having a one-bit flag per register position in the CAM. For example, the flag may be enabled if the register stores data that is equal to the input signal and disabled otherwise.

The CAM 100 contains match logic 120 associated with each register 110. The match logic 120 performs a bit-by-bit comparison of the input data and the data stored in the register 110. As shown in FIG. 4, it includes selection switches 130–160, one provided for each bit position C0–C3 of data in the register 110. Each switch 130–160 is controlled by the value of the associated bit position in the register 110. The output of each selection switch 130–160 is input to an AND gate 170.

Typically, for each bit position $D_i$ in the input signal, the match logic generates its complement, Di# (not shown). $D_i$ and Di# are input to the switch associated with register it position i. The value of the data stored in the register at bit position i controls which of $D_i$ and Di# are output to the AND gate 170 from the switch.

The AND gate 170 generates a signal representing a logical AND of the values output from each of the selection switches 130–160. The AND is a logical 1 only when the signal input to the CAM 100 has the same value as the data stored in the register 110.

No known memory system operates on redundant form input data. Accordingly, there is a need in the art for a content addressable memory system that reduces latency of memory requests when those requests include arithmetic operations. Further, there is a need in the art for a content addressable memory that operates on redundant form input data.

SUMMARY OF THE INVENTION

Embodiments of the present invention provide a content addressable memory addressable by redundant form input data.

BRIEF DESCRIPTION OF THE DRAWINGS

FIG. 3 is a block diagram of a known content addressable memory.

FIG. 4 is a block diagram of match logic conventional form content addressable memories.

FIG. 5 is a block diagram of a content addressable memory constructed in accordance with an embodiment of the present invention.

FIG. 6A is a logic diagram of a data decoder stage constructed in accordance with a first embodiment of the present invention.

FIG. 6B is a logic diagram of a data decoder stage constructed in accordance with a second embodiment of the present invention.

DETAILED DESCRIPTION

Figure 9:
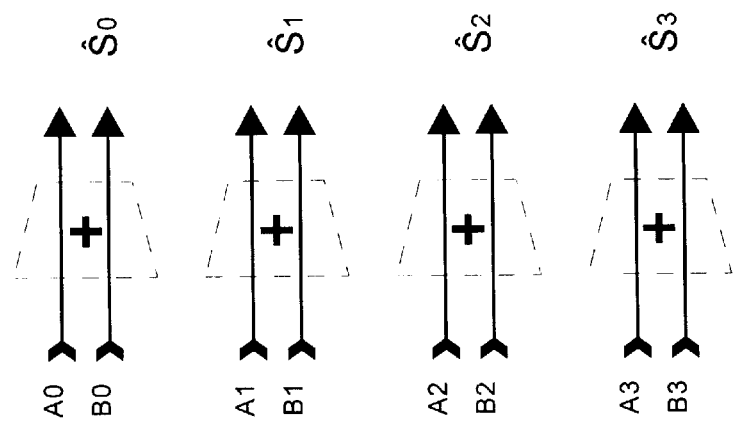
FIG. 9 illustrates how an adder of the prior art may be omitted according to use of the content addressable memory of FIG. 5.

The present invention provides a content addressable memory that compares the value of redundant form input data to non-redundant form values stored therein. The CAM decodes the redundant form data in a data decoder. Thereafter, the CAM performs match detection on the decoded data. The present invention performs decoding and match detection more quickly than traditional adders and even more quickly than complete redundant form adders.

FIG. 5 illustrates a CAM 200 constructed in accordance with an embodiment of the present invention. The CAM 200 includes a data decoder 210 and a plurality of registers 220. The data decoder 210 receives redundant form input data $\hat{S}$ [$\hat{S}=\hat{S}_m\_\hat{S}_{m+n}$] and decodes it into data signals. The decoded redundant form data is input to match detection logic (not shown in FIG. 5) associated with each register. The CAM 200 generates an output representing which registers, if any, store data having the same value as the redundant form input data.

The data decoder 210 is a multi-bit decoder. It is populated by several stages of redundant form decoding circuits. The CAM 200 is adapted for use with predetermined bits of $\hat{S}$, $\hat{S}_m\_\hat{S}_{m+n}$. Match detection logic of CAM 200 may be different for cases where m=0 and where m≠0. A first embodiment of a redundant form decoding circuit is appropriate use with each redundant form "bit position" $\hat{S}_i$ for i≠0. For $\hat{S}_0$, a second embodiment of the redundant form decoding circuit is appropriate.

FIG. 6A illustrates a redundant form decoder circuit 300 for bit position $\hat{S}_i$ (i≠0) constructed in accordance with an embodiment of the present invention. The decoder circuit 300 generates address signals $Z_{ia}$, $Z_{ib}$, $Z_{ic}$ and $Z_{id}$ based upon the values of $\hat{S}_i$ ($A_i$, $B_i$) and $\hat{S}_{i-1}$ ($A_{i-1}$ and $B_{i-1}$). Values $A_i$, $B_i$, $A_{i-1}$ and $B_{i-1}$ are input to the decoder 300 on inputs 302, 304, 306 and 308 respectively. Address signals $Z_{ia}$, $Z_{ib}$, $Z_{ic}$ and $Z_{id}$ are output from the decoder 300 on outputs 310, 312, 314 and 316 respectively.

$A_i$ and $B_i$ are input to a first XOR gate 320. XOR gate 320 generates an output on line 322. Line 322 is input to a pair of XOR gates 324 and 326. XOR gate 324 generates the first differential pair of address signals $Z_{ia}$ and $Z_{ib}$. XOR gate 326 generates the second differential pair of address signals $Z_{ic}$ and $Z_{id}$.

$A_{i-1}$ and $B_{i-1}$ are input to an AND gate 328 and to an OR gate 334. AND gate 328 generates an output on line 332 which is input to XOR gate 324. The OR gate 334 generates an output on line 338 which is input to XOR gate 326.

The redundant form decoder circuit 300 resembles a traditional adder to a great degree. Line 322 represents a non-redundant sum that would be obtained by adding $A_i$ to $B_i$. Lines 332 and 338 represent carries from position i−1 under appropriate circumstances:

The signal on line 332 represents the carry from position i−1 when $S_{i-1}=1$ (as described later).

The signal on line 338 represents the carry from position i−1 when $S_{i-1}=0$ (as described later).

Thus, either $Z_{ia}$ or $Z_{ic}$ represents the non-redundant sum bit $S_i$. Identification of the one address line that carries the correct value, of $S_i$ is determined based on additional information. This is discussed in connection with FIG. 7 below.

A traditional adder, however, requires an internal carry chain that propagates through every bit position in the addition. The redundant form decoder circuit 300 does not include any carry in from position i−2.

The redundant form decoder circuit 300 may be but one stage of a multi-bit decoder. The gates shown in FIG. 6A may be shared with other stages to form a complete multi-bit decoder. For example, additional gates 340 and 342 (shown in phantom) illustrate gates that would be provided to interconnect inputs $A_i$ and $B_i$ to the i+1 position decoder. They correspond to gates 328 and 334 in the $i^{th}$ position decoder. Gate 330 (also in phantom) may be used in an i−1 position decoder.

FIG. 6B illustrates a redundant form decoder circuit 400 constructed in accordance with an embodiment of the present invention. The decoder circuit 400 is suitable for use with redundant form bit $\hat{S}_0$. Again, for notational purposes, the two bits of $\hat{S}_0$ are represented as $A_0$ and $B_0$ respectively. They are input to the decoder circuit 400 at input terminals 402 and 404. The decoder circuit 400 generates a single differential pair of address lines $Z_{0a}$ and $Z_{0b}$ on output terminals 406 and 408.

$A_0$ and $B_0$ are input to an XOR gate 410. XOR gate 410 generates an output on line 412. A carry in $C_{in}$, if provided for bit position 0, is input at input terminal 416. A second XOR gate 414 receives inputs from line 412 and terminal 416. The second XOR gate 414 generates $Z_{0a}$ and $Z_{0b}$ on outputs 406 and 408. If no carry in $C_{in}$ is provided, the second XOR gate 414 may be omitted. $Z_{0a}$ and $Z_{0b}$ may be generated directly from the first XOR gate 410.

Figure 7:
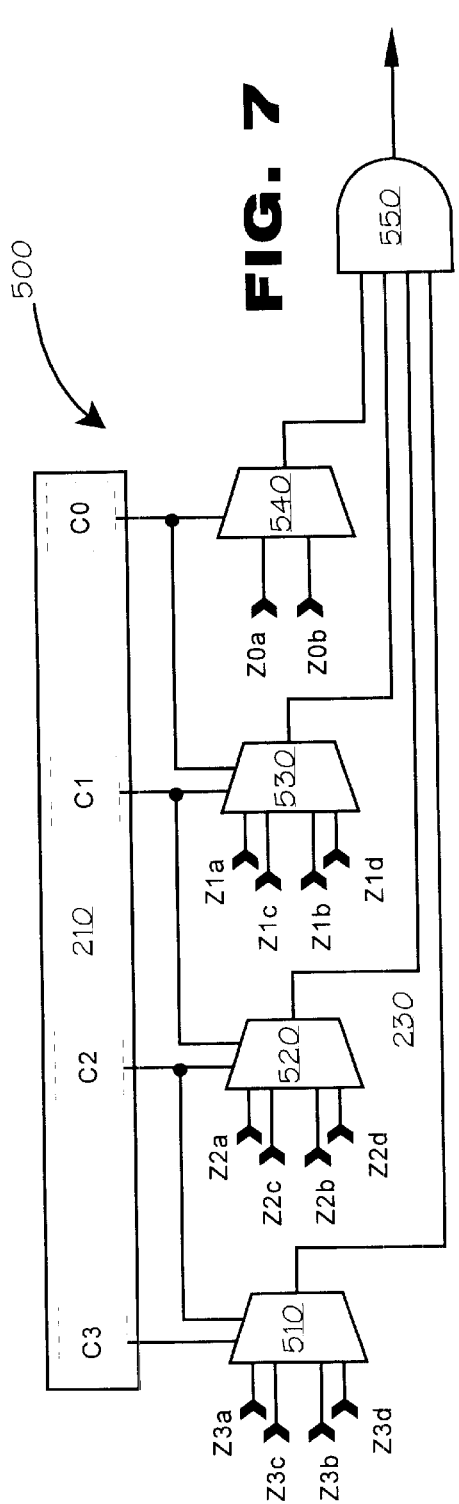
FIG. 7 is a block diagram of match detection logic constructed in accordance with a first embodiment of the present invention.

FIG. 7 illustrates match detection logic 500 constructed in accordance with a first embodiment of the present invention. The match detection logic 500 may substitute for the match detection logic 230 of FIG. 5. The match detection logic 500 includes a selection switch 510–540 provided for each bit position in the register. For each bit position i=0, four data signals $Z_{ia}$–$Z_{id}$ are input to the selection switch 510–530. For bit position i=0, the two data signals $Z_{0a}$–$Z_{0b}$ are input to selection switch 540. The output of each selection switch 510–540 is input to an AND gate 550. AND gate 550 generates an enabled output only if all selection switches 510–540 output a logical "1" signal.

For each bit position i≠0, the associated selection switch 510–530 is controlled by the values stored in the register at bit positions i and i−1. Thus, switch 510 is controlled by values C3 and C2, switch 520 is controlled by the values of C2 and C1 and switch 530 is controlled by the values of C1 and C0. Switch 540, however, is controlled solely by the value of C0.

Specifically, the address signals $Z_{ia}$–$Z_{id}$ from the decoder circuit 300 are connected to the selection switch of position i as follows:

$Z_{ia}$ is connected to the switch input that is selected when Ci and Ci−1 are "11;"

$Z_{ib}$ is connected to the switch input that is selected when Ci and Ci−1 are "01;"

$Z_{ic}$ is connected to the switch input that is selected when Ci and Ci−1 are "10;" and $Z_{id}$ is connected to the switch input that is selected when Ci and Ci−1 are "00." Thus, Ci−1 is an additional "known" quantity described above with respect to FIG. 6A. For each bit position i≠0, the decoder assumes that $S_{i-1}$, is the value of Ci−1 actually stored in the memory register. The assumption is justifiable because, if it were not true, then one of the selection switches 220–250 would route a 0 to the AND 260 gate and prevent it from erroneously signaling a match.

Table 1 illustrates the signal values $Z_{ia}$–$Z_{ib}$ take for all possible permutations of $A_i$, $B_i$, $A_{i-1}$ and $B_{i-1}$ and Ci−1. It also shows the non-redundant values that Ci will take under each circumstance. Highlighting in the table demonstrates that, for the various combinations of $A_i$, $B_i$, $A_{i-1}$, $B_{i-1}$, and Ci−1 only one Of $Z_{ia}$ and $Z_{ic}$ represent Ci.

TABLE 1

Decoded Data Signals Based On $S_i$ and $S_{i-1}$

| $A_i$ | $B_i$ | $A_{i-1}$ | $B_{i-1}$ | $C_{i-1}$ | $C_i$ | $Z_{ia}$ | $Z_{ib}$ | $Z_{ic}$ | $Z_{id}$ | $A_i$ | $B_i$ | $A_{i-1}$ | $B_{i-1}$ | $C_{i-1}$ | $C_i$ | $Z_{ia}$ | $Z_{ib}$ | $Z_{ic}$ | $Z_{id}$ |
|---|---|---|---|---|---|---|---|---|---|---|---|---|---|---|---|---|---|---|---|
| 0 | 0 | 0 | 0 | 0 | 0 | 0 | 1 | 0 | 1 | 0 | 0 | 0 | 0 | 1 | 0 | 0 | 1 | 0 | 1 |
| 0 | 1 | 0 | 1 | 0 | 0 | 1 | 0 | 0 | 1 | 0 | 0 | 0 | 1 | 1 | 0 | 0 | 1 | 1 | 0 |
| 0 | 1 | 1 | 0 | 0 | 0 | 1 | 0 | 0 | 1 | 0 | 0 | 1 | 0 | 1 | 0 | 0 | 1 | 1 | 0 |
| 0 | 1 | 1 | 1 | 0 | 0 | 0 | 1 | 0 | 1 | 0 | 1 | 1 | 1 | 1 | 0 | 0 | 1 | 0 | 1 |
| 1 | 0 | 0 | 1 | 0 | 0 | 1 | 0 | 0 | 1 | 1 | 0 | 1 | 1 | 1 | 0 | 0 | 1 | 0 | 1 |
| 1 | 0 | 1 | 0 | 0 | 0 | 1 | 0 | 0 | 1 | 1 | 1 | 0 | 0 | 1 | 0 | 0 | 1 | 0 | 1 |
| 1 | 0 | 1 | 1 | 0 | 0 | 0 | 1 | 0 | 1 | 1 | 1 | 0 | 1 | 1 | 0 | 0 | 1 | 1 | 0 |
| 1 | 1 | 0 | 0 | 0 | 0 | 0 | 1 | 0 | 1 | 1 | 1 | 1 | 0 | 1 | 0 | 0 | 1 | 1 | 0 |
| 0 | 0 | 0 | 1 | 0 | 1 | 0 | 1 | 1 | 0 | 0 | 0 | 0 | 1 | 1 | 1 | 1 | 0 | 1 | 0 |
| 0 | 0 | 1 | 0 | 0 | 1 | 0 | 1 | 1 | 0 | 0 | 0 | 1 | 0 | 0 | 1 | 1 | 0 | 1 | 0 |
| 0 | 0 | 1 | 1 | 0 | 1 | 1 | 0 | 1 | 0 | 0 | 0 | 1 | 1 | 1 | 1 | 0 | 0 | 1 | 1 |
| 0 | 1 | 0 | 0 | 0 | 1 | 1 | 0 | 1 | 0 | 0 | 1 | 0 | 0 | 1 | 1 | 1 | 0 | 0 | 1 |
| 1 | 0 | 0 | 0 | 0 | 1 | 1 | 0 | 1 | 0 | 1 | 0 | 0 | 0 | 1 | 1 | 1 | 0 | 1 | 0 |
| 1 | 1 | 0 | 1 | 0 | 1 | 0 | 1 | 1 | 0 | 1 | 0 | 0 | 1 | 1 | 1 | 1 | 0 | 0 | 1 |
| 1 | 1 | 1 | 0 | 0 | 1 | 0 | 1 | 1 | 0 | 1 | 0 | 1 | 0 | 1 | 1 | 1 | 0 | 0 | 1 |
| 1 | 1 | 1 | 1 | 0 | 1 | 1 | 0 | 1 | 0 | 1 | 1 | 1 | 1 | 1 | 1 | 0 | 1 | 0 | 0 |

$Z_{ib}$ and $Z_{id}$ are provided because, for the AND gate 550 to indicate a match it must receive inputs that are entirely 1. If $Z_{ia}=Ci=0$, $Z_{ib}$ is input to the AND gate 550. Similarly, if $Z_{ic}=Ci=0$, $Z_{id}$ is input to the AND gate 550.

Interconnection of $Z_{0a}$ and $Z_{0b}$ to switch 540 is straightforward:

$Z_{0a}$ is connected to the switch input that is selected when $S_0$ is "1," and $Z_{0b}$ is connected to the switch input that is selected when $S_0$ is "0." Based on a redundant form input signal, the CAM 200 of the present invention decodes the redundant form signal and determines whether non-redundant data stored in any of the registers 220 equals the value of the input signal. It generates an output identifying those registers storing the same value.

Figure 1:
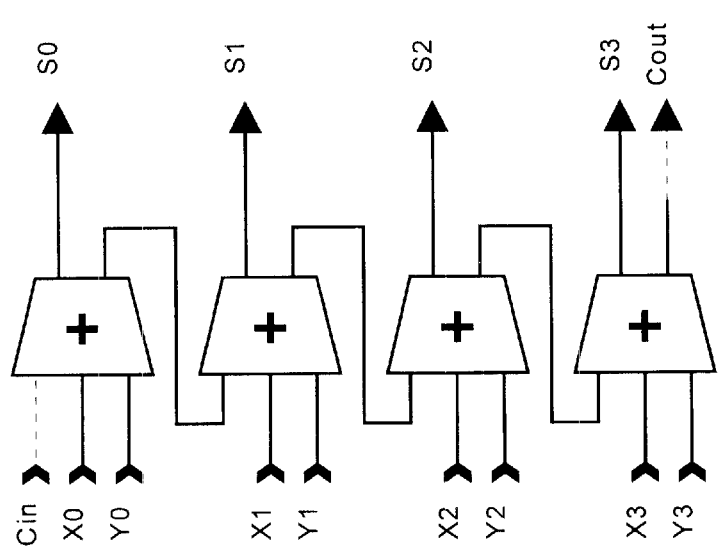
FIG. 1 is a block diagram of a known traditional adder.

The data decoder 210 of the present invention does not possess a carry chain that characterizes the traditional adder of FIG. 1. Thus, while it is traditionally viewed that redundant form data must be input to a traditional adder (having a carry chain) before non-redundant data may be obtained, the present invention provides improved processing over such a scheme. Here, the decoded data signals $Z_{ia}$–$Z_{id}$ are generated based only on values of the redundant form data at $\hat{S}_i$ and $\hat{S}_{i-1}$. The data decoder is properly viewed, not as propagating a carry chain through all bit positions, but rather as generating signals $Z_{ia}$–$Z_{id}$ based on possible assumptions of the value of a carry in to the bit position. The actual values of data stored in the register demonstrate which of the assumptions actually is true.

Figure 8:
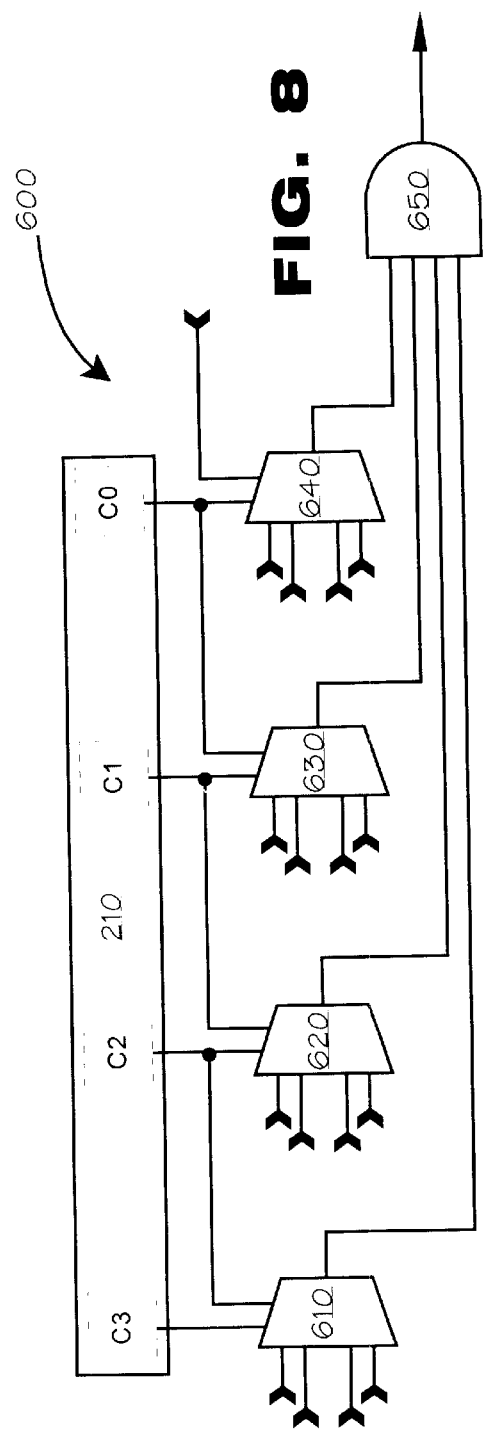
FIG. 8 is a block diagram of match detection logic constructed in accordance with a second embodiment of the present invention.

FIG. 8 illustrates match detection logic 600 constructed in accordance with a second embodiment of the present invention. The match detection logic 600 may substitute for the match detection logic 230 of FIG. 5. Here, the least significant bit position of the redundant form input data does not correspond to a bit position stored in a register 220. Instead, redundant form bits $\hat{S}_m$–$\hat{S}_{m+n}$ are input to the CAM 200 (m≠0). The match detection logic 600 provides one selection switch 610–640 for each bit position i (i=m to m+n) of data stored in the register 220. Each selection switch 610–640 receives decoded data signals $Z_{ia}$–$Z_{id}$ associated with the bit position i. An output from each selection switch 610–640 is input to an AND gate 650. The AND gate 650 generates an output signal representative of whether the input redundant form data signal has a value equal to the data stored in the register 220.

The selection switches 610–630 of each bit position i (i≠m) is controlled by the value of data stored in the register at bit positions i and i–1. Selection switch 640 is controlled by the value of data stored in bit position i=m and by a carry in $C_{in}$. The carry in, $C_{in}$, is to be the binary value of $S_{m-1}$. There are two ways that $S_{m-1}$ may be obtained. The first way, a complete addition is performed in bit positions 0 through m–1 to directly compute $S_{m-1}$. However, $S_{m-1}$ may be computed indirectly. External logic may be arranged so that, unless $S_{m-1}$ has a predetermined value (0 or 1), the result of the CAM match is irrelevant. In an embodiment, the external logic will require $S_{m-1}$ to be Cin for the CAM result to be relevant. If it is not (if $S_{m-1} \neq C_{in}$), then some other input to gate 650 will be low and prevent the gate from generating a false match signal. This indirect computational method likely will be faster than the direct computation of $S_{m-1}$.

Thus, the present invention provides for a content addressable memory responsive to redundant form inputs. The CAM may perform redundant form decoding on any redundant form data pattern and may receive, but need not receive, the least significant bit $S_0$ of the redundant form input. Where the least significant bit is not input to the data decoder, a carry in derived from the lower significant bits of the redundant form value is input to the match detection logic to control one of the selection switches.

Figure 2:
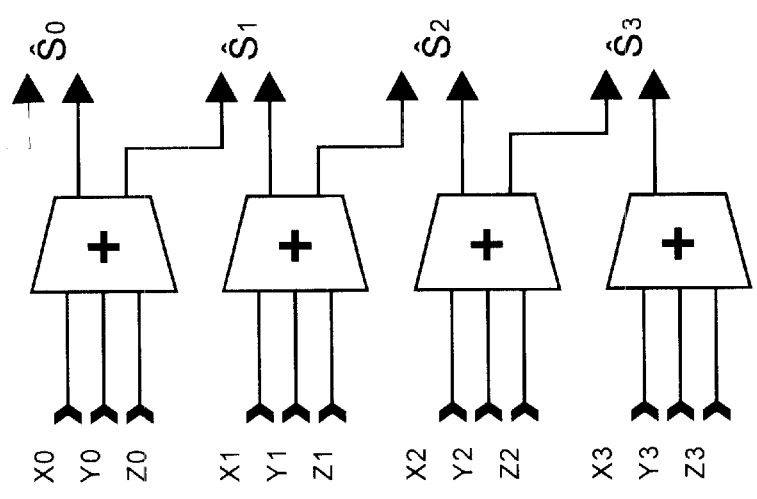
FIG. 2 is a block diagram of a known redundant form adder.

Returning to FIG. 2, the example of redundant form adders illustrate a three input add. The adder of FIG. 2 may be known to some as a "three to two compressor."

In a special case, it may be possible to omit arithmetic preprocessing altogether from a memory operation. Where a memory request is posted as a single arithmetic operation to be performed on two non-redundant inputs A and B ($\hat{S}=A+B$), the addition may be omitted entirely. Instead, the inputs A and B may be input directly to the data decoder 210. As shown in FIG. 9, no processing is required to "add" two non-redundant values in redundant form. The values A and B may be input without preprocessing directly to the data decoder 210.

Accordingly, the CAM 200 of the present invention receives the two non-redundant values as a redundant form input. That is, the two non-redundant values are merged as a redundant form number and input to the data decoder 210. The data decoder 210 performs redundant form decoding as described above. Based upon the decoded data output from the data decoder 210, the match detection logic 230 addresses the values stored in the CAM registers 220.

As has been described above, the present invention provides a content addressable memory that is addressable by redundant form input data. The CAM decodes the redundant form input data and, based upon the decoded data, performs match detection with data stored in the CAM registers.

Several embodiments of the present invention are specifically illustrated and described herein. However, it will be appreciated that modifications and variations of the present invention are covered by the above teachings and within the purview of the appended claims without departing from the spirit and intended scope of the invention.

I claim:

1. A content addressable memory, comprising:
a redundant form data decoder having an input and a plurality of decoded data lines at an output,
a register, and
match detection logic coupled to the decoded data lines and to the register, comprising a selection switch for each bit position stored in the register, the selection switch having inputs connected to decoded data lines associated with the bit position, wherein the selection switch of a least significant bit position of the register controlled by a value of the stored at the least significant bit position and an input carry value and the remaining selection switches are controlled respectively by the values stored in the register at the bit position associated with the switch and an adjacent bit position.

2. A content addressable memory, comprising:
a redundant form data decoder receiving redundant form input data, and having an output, and
a register storing data of a predetermined width,
match detection logic comprising a selection switch associated with each bit position of data stored in the register, the selection switch receiving decoded data associated with the bit position at inputs, the selection switch of a least significant bit position of the register controlled by a value of the stored at the least significant bit position and an input carry value, remaining selection switches controlled by the value of data stored at the bit position and the next adjacent bit position; and
an AND gate having inputs connected to the outputs of the selection switches.

3. The content addressable memory of claim 2, wherein the data decoder receives two bits of redundant form data for every bit position of data stored in the register.

4. The content addressable memory of claim 2, wherein the data decoder comprises a plurality of data decoding stages, at least one of the stages comprising:
first through fourth XOR gates,
input terminals for redundant form data associated with a first and second bit positions,
a fifth XOR gate having inputs connected to the input terminals associated with the first redundant bit positions and generating a first output representing the XOR of the first redundant bit positions and a second output representing the complement of the XOR of the first redundant bit positions,
a sixth XOR gate having inputs connected to the input terminals associated with the second redundant bit positions and having an output,
an AND gate having inputs connected to the input terminals associated with the second redundant bit positions and having an output,
an OR gate having inputs connected to the outputs of the sixth XOR gate and the AND gate,
wherein:
the first XOR gate has inputs connected to the first output of the fifth XOR gate and to the output of the AND gate,
the second XOR gate has inputs connected to the second output of the fifth XOR gate and to the output of the AND gate,
the third XOR gate has inputs connected to the first output of the fifth XOR gate and to the output of the OR gate, and
the fourth XOR gate has inputs connected to the second output of the fifth XOR gate and to the output of the OR gate.

5. The content addressable memory of claim 2, wherein the data decoder includes a decoding circuit associated with the least significant bit position of the redundant form data, the decoding circuit comprising:
input terminals for each bit of the least significant bit position of the redundant form data, and
an XOR gate having inputs connected to the input terminals and generating a first output representing the XOR of the inputs thereto and a second output representing the complement of the XOR of the inputs thereto.

6. A content addressable memory, comprising:
a plurality of memory registers having a width of a predetermined number of bit positions,
a multi-bit data decoder having a plurality of decoding stages, a stage associated with each bit position of the registers and generating decoded data on output lines, the decoder receiving at an input redundant form data, and
match detection logic coupled to the output lines of the data decoder and to the registers, wherein
a decoding stage outputs decoded data on four output lines in differential pairs, at least one of output lines representing a non-redundant value of the redundant form data at the bit position associated with the decoding stage
the match detection logic includes a selection switch provided in association with the bit position, the selection switch receiving each of the output lines from the decoding stage, the selection switch of a least significant bit position of the register controlled by a value of the stored at the least significant bit position and an input carry value and the remaining selection switches controlled by data stored in one of the registers at the bit position and the next lower bit position.

7. The content addressable memory of claim 6, further comprising an AND gate coupled to an output of the selection switch.

* * * * *